(12) United States Patent
Kim et al.

(10) Patent No.: US 7,534,708 B2
(45) Date of Patent: May 19, 2009

(54) RECESSED-TYPE FIELD EFFECT TRANSISTOR WITH REDUCED BODY EFFECT

(75) Inventors: Dong-Hyun Kim, Suwon-Si (KR);
Du-Heon Song, Yongin-Si (KR);
Sang-Hyun Lee, Seoul (KR);
Hyeoung-Won Seo, Yongin-Si (KR);
Dae-Joong Won, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/452,867

(22) Filed: Jun. 14, 2006

(65) Prior Publication Data
US 2006/0234437 A1 Oct. 19, 2006

Related U.S. Application Data

(62) Division of application No. 11/051,834, filed on Feb. 4, 2005, now abandoned.

(30) Foreign Application Priority Data
Feb. 11, 2004 (KR) .............................. 2004-0009122

(51) Int. Cl.
*H01L 21/3205* (2006.01)
(52) U.S. Cl. ................... 438/589; 438/239; 438/291

(58) Field of Classification Search .................. 438/217, 438/239, 289–291, 589, 259
See application file for complete search history.

(56) References Cited

U.S. PATENT DOCUMENTS

| 5,371,024 | A | * | 12/1994 | Hieda et al. ............. 438/291 |
| 6,358,817 | B1 | * | 3/2002 | Hibi ...................... 438/430 |
| 6,844,591 | B1 | * | 1/2005 | Tran ...................... 257/330 |
| 6,855,604 | B2 | * | 2/2005 | Lee ....................... 438/270 |
| 2003/0170955 | A1 | * | 9/2003 | Kawamura et al. ....... 438/270 |
| 2005/0001266 | A1 | * | 1/2005 | Kim ....................... 257/330 |
| 2005/0167741 | A1 | * | 8/2005 | Divakaruni et al. ...... 257/328 |
| 2005/0196947 | A1 | * | 9/2005 | Seo et al. ................ 438/589 |
| 2005/0199930 | A1 | * | 9/2005 | Seo et al. ................ 257/296 |
| 2007/0010058 | A1 | * | 1/2007 | Juengling ................ 438/259 |

* cited by examiner

*Primary Examiner*—M. Wilczewski
*Assistant Examiner*—Toniae M Thomas
(74) *Attorney, Agent, or Firm*—Monica H. Choi

(57) ABSTRACT

For fabricating a field effect transistor, an extra-doped channel region is formed below a surface of a semiconductor substrate. An opening is formed in the semiconductor substrate into the extra-doped channel region. A gate insulator is formed at walls of the opening such that the extra-doped channel region abuts the gate insulator at a bottom portion of the opening. The opening is filled with a gate electrode. Such an extra-doped channel region prevents undesired body effect in the field effect transistor.

20 Claims, 14 Drawing Sheets

US 7,534,708 B2

RECESSED-TYPE FIELD EFFECT TRANSISTOR WITH REDUCED BODY EFFECT

The present application is a divisional of an earlier filed patent application with Ser. No. 11/051,834 filed on Feb. 4, 2005 now abandoned, for which priority is claimed. This earlier filed patent application with Ser. No. 11/051,834 is in its entirety incorporated herewith by reference.

This patent application claims priority to Korean Patent Application No. 2004-0009122, filed on Feb. 11, 2004 in the Korean Intellectual Property Office, the disclosure of which is hereby incorporated by reference in its entirety. A certified copy of Korean Patent Application No. 2004-0009122 is contained in the parent patent Application with Ser. No. 11/051,834.

BACKGROUND OF THE INVENTION

1. Field of the Invention

The present invention relates generally to integrated circuit fabrication, and more particularly to fabrication of a recessed-type field effect transistor with an extra-doped channel region to reduce body effect.

2. Description of the Related Art

Field effect transistors are a common component of many integrated circuits. A field effect transistor includes a source and a drain for defining a channel region, a gate insulator, and a gate electrode. The structure and operation of a field effect transistor is by now well known to one of ordinary skill in the art of electronics.

As device dimensions are constantly scaled down, the channel length of the field effect transistor is continually reduced. However, undesired short-channel effects result in the field effect transistor from such reduced channel length.

For preventing such undesired short-channel effects, a recessed-type field effect transistor is formed with the gate electrode filling a trench in a semiconductor substrate. Because the channel length is along the bottom wall and sidewalls of the trench, the channel length is increased for decreasing short channel effects.

For example, U.S. Pat. No. 5,817,558 to Shye Lin Wu (hereafter referred to as "Wu") discloses such a recessed-type field effect transistor. The recessed-type field effect transistor of Wu includes a gate electrode filling an opening formed within a semiconductor substrate. In addition, an anti-punch through layer is formed below such an opening in Wu for preventing leakage current between the source and the drain.

However, the anti-punch through layer in Wu is formed well below the opening such that the field effect transistor of Wu is still susceptible to undesired body effect. Generally, the body effect refers to variation of threshold voltage of the field effect transistor from bias on the semiconductor substrate. In Wu, the anti-punch through layer does not abut the walls of the opening such that the anti-punch through layer does not prevent the undesired body effect.

SUMMARY OF THE INVENTION

Accordingly, a field effect transistor is formed with an extra-doped channel region for preventing undesired body effect.

For fabricating a field effect transistor, an extra-doped channel region is formed below a surface of a semiconductor substrate. An opening is formed in the semiconductor substrate into the extra-doped channel region. A gate insulator is formed at walls of the opening such that the extra-doped channel region abuts the gate insulator at a bottom portion of the opening. The opening is filled with a gate electrode.

In one embodiment of the present invention, the extra-doped channel region abuts the gate insulator at a bottom wall and sidewalls of the opening below a half-height of the opening. In another embodiment of the present invention, the opening is formed after the extra-doped channel region is formed. In addition, a drain and a source are formed in the semiconductor substrate to the sides of the opening with an overlap under the gate insulator and the gate electrode.

In a further embodiment of the present invention, the conductivity type of a dopant within the extra-doped channel region is opposite to a respective conductivity type of a respective dopant in each of the drain, the source, and the gate electrode. In another embodiment of the present invention, a respective line pad is formed on each of the drain and the source.

In an example application, the field effect transistor is formed as part of a DRAM (dynamic random access memory) cell. In that case, the respective line pad disposed on the source is coupled to a storage capacitor of the DRAM cell, and the gate electrode forms a word line for the DRAM cell. However, the field effect transistor of the present invention may be applied for other types of integrated circuits.

In this manner, because the extra-doped channel region abuts the gate insulator at walls of the opening of the recessed type field effect transistor, body effect is prevented. Thus, the field effect transistor has a more stable threshold voltage for more stable operation.

BRIEF DESCRIPTION OF THE DRAWINGS

The above and other features and advantages of the present invention will become more apparent when described in detailed exemplary embodiments thereof with reference to the attached drawings in which.

The figures referred to herein are drawn for clarity of illustration and are not necessarily drawn to scale. Elements having the same reference number in FIGS. 1, 2, 3, 4, 5, 6, 7, 8, 9, 10, 11, 12, 13, 14, 15, and 16 refer to elements having similar structure and/or function.

DETAILED DESCRIPTION OF THE INVENTION

Figure 1:
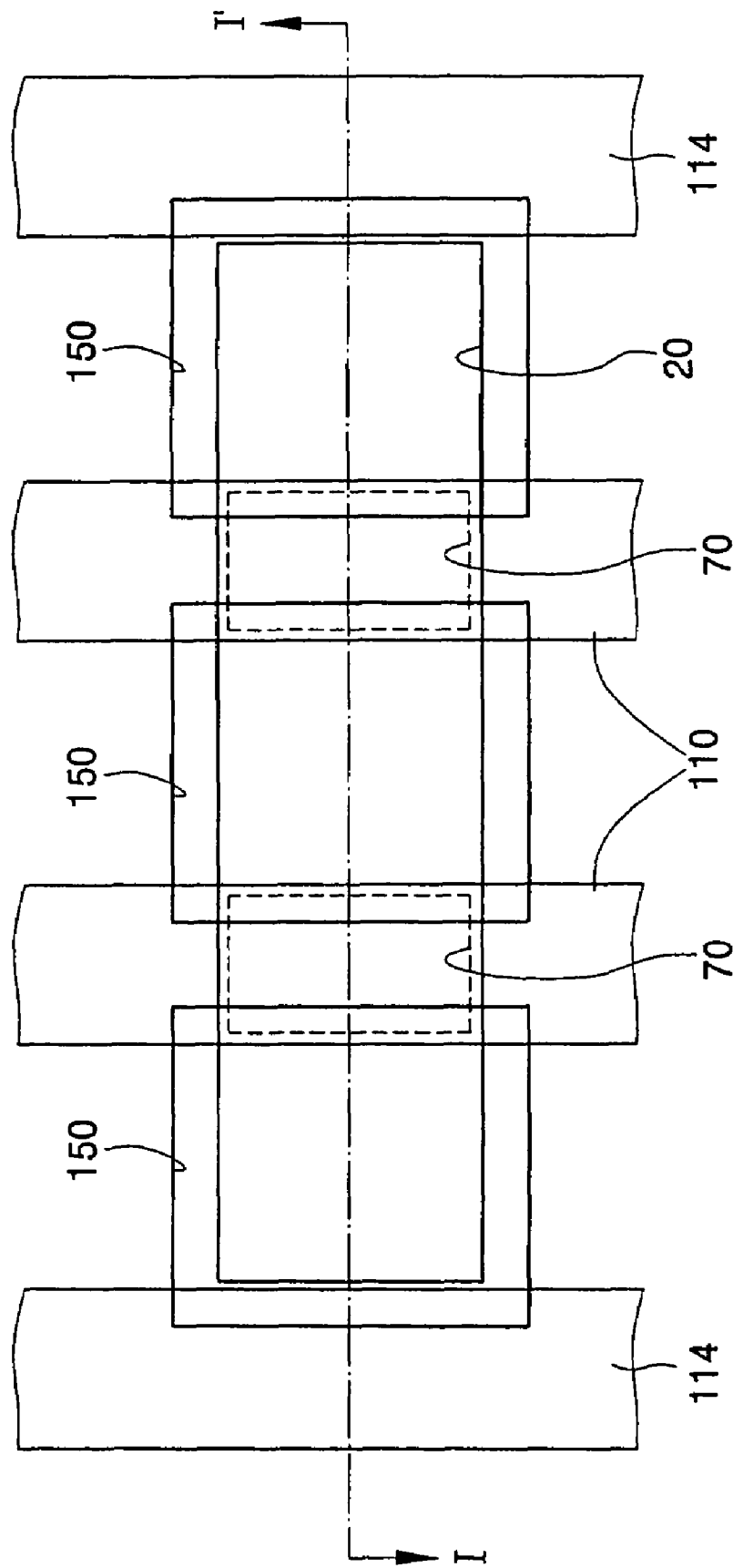
FIG. 1 shows a layout of field effect transistors with reduced body effect, according to an embodiment of the present invention.
Figure 2:
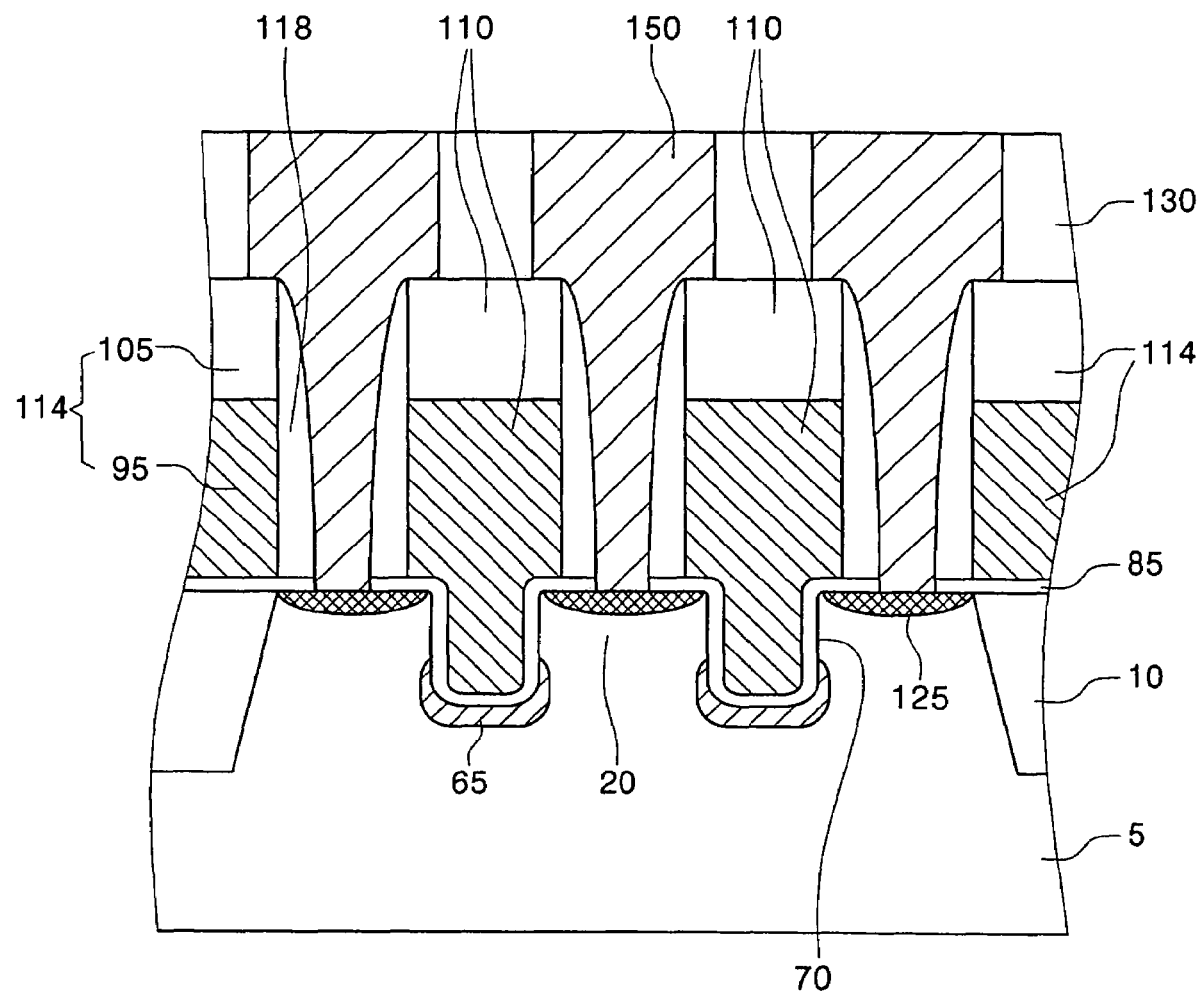
FIG. 2 shows a cross-sectional view along line I-I' of FIG. 1, according to an embodiment of the present invention.

FIG. 1 shows a layout of field effect transistors formed according to an embodiment of the present invention. FIG. 2 shows a cross-sectional view of such field effect transistors along line I-I' of FIG. 1.

Referring to FIGS. 1 and 2, a STI (shallow trench isolation) structure 10 is formed within a semiconductor substrate 5 to define an active region 20. The STI structure 10 is comprised of an insulating material such as silicon dioxide ($SiO_2$), and the semiconductor substrate 5 is comprised of a semiconductor material such as silicon. At least one opening 70 is formed into the semiconductor substrate 5 within the active region 20. The openings 70 each have a trench shape in one embodiment of the present invention.

Each opening 70 has a gate insulator 85 formed at walls including a bottom wall and side walls of the opening 70. In addition, an extra-doped channel region 65 is formed to surround a bottom portion of each opening 70. For example, the extra-doped channel region 65 abuts the gate insulator 85 at the bottom wall and the sidewalls of the opening 70. The extra-doped channel region 65 abuts the gate insulator 85 only below a lower half of the height of the opening 70, according to one embodiment of the present invention.

In addition, a gate electrode 95 fills each opening 70, and a gate capping layer 105 is formed on each gate electrode 95. Each gate electrode 95 and gate capping layer 105 formed within the active region 20 forms a respective gate line pattern 110 for a respective field effect transistor. In addition, each gate electrode 95 and gate capping layer 105 formed on the STI structure 10 forms an inactive gate line pattern 114.

In one embodiment of the present invention, the gate line patterns 110 and 114 are formed as parallel lines as illustrated in FIG. 1. In an example application of the present invention, the field effect transistors of FIG. 2 are formed within a DRAM (dynamic random access memory) device. In that case, the gate electrodes 95 formed within the active region 20 form word-lines of the DRAM device.

Each gate electrode 95 is comprised of polysilicon of N-type or P-type conductivity and a metal silicide stacked thereon. In addition, the polysilicon of the gate electrode 95 has a conductivity that is opposite to the conductivity of the extra-doped channel region 65. The gate capping layer 105 is comprised of silicon nitride ($Si_3N_4$) in an embodiment of the present invention.

Further referring to FIG. 2, spacers 118 are disposed on sidewalls of the gate electrode 95 and gate capping layer 105. The gate insulator 85 formed on walls of the opening 70 is also disposed under the spacers 118. The spacers 118 are comprised of an insulating material having the same etch selectivity as the gate capping layer 105. The gate insulator 85 is comprised of an insulating material having an etch selectivity different from the gate capping layer 105. The gate insulator is comprised of a silicon oxide ($Si_xO_y$) or a silicon oxynitride ($Si_xO_yN_z$), in one embodiment of the present invention.

A source/drain 125 is formed within the semiconductor substrate 5 to the sides of the opening 70. A pair of the source/drains 125 disposed to the two sides of the opening 70 within the active region 20 form a source and a drain for a field effect transistor. In addition, such a source and drain pair 125 and the gate electrode 95 and the gate insulator 85 filling such an opening 70 define a field effect transistor of the present invention. Each source/drain 125 is formed under a portion of the gate electrode 95 and the gate insulator 85. Thus, each source/drain 125 is formed to overlap a portion of the gate electrode 95 and the gate insulator 85.

Each source/drain 125 is doped with a dopant of a second conductivity type that is opposite of the first conductivity type of the dopant within the extra-doped channel region 65, in one embodiment of the present invention. A respective landing pad 150 is disposed on and contacts each source/drain 125. The lower portion of the landing pad 150 extends between the spacers 118, and the upper portion of the landing pad 150 is surrounded by an interlayer insulating layer 130. In addition, the present invention may be practiced with the conductivity of the dopant within the extra-doped channel region 65 being the same or opposite of the conductivity of the semiconductor substrate 5.

Figure 3:
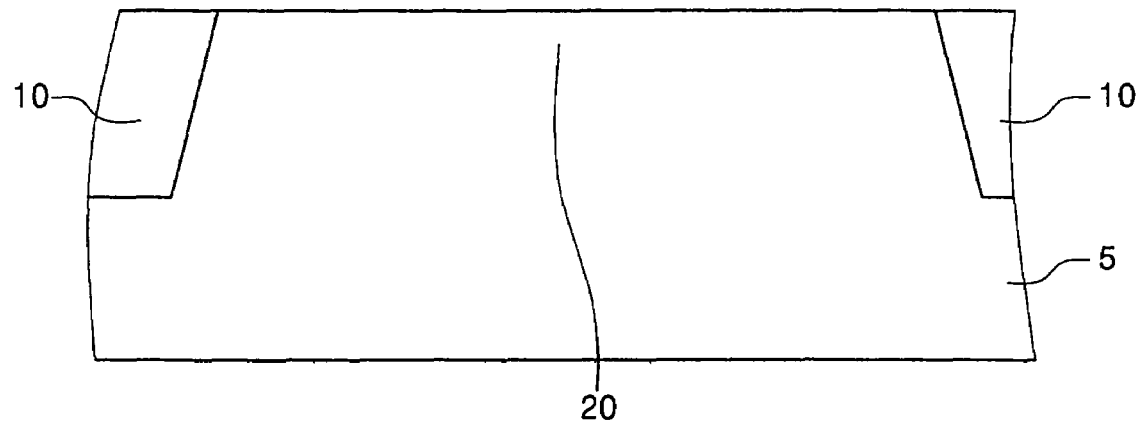
FIGS. 3, 4, 5, 6, 7, 8, 9, 10, 11, 12, 13, 14, and 15 show cross-sectional views during steps for fabricating the field effects transistors of FIGS. 1 and 2, according to an embodiment of the present invention.

FIGS. 3, 4, 5, 6, 7, 8, 9, 10, 11, 12, 13, 14, and 15 show cross-sectional views during steps for fabricating the field effect transistors of FIGS. 1 and 2, according to an embodiment of the present invention. Referring to FIG. 3, the STI (shallow trench isolation) structure 10 is formed in the semiconductor substrate 5 to define the active region 20. The STI structure 10 is comprised of an insulating material such as silicon dioxide ($SiO_2$).

Figure 4:
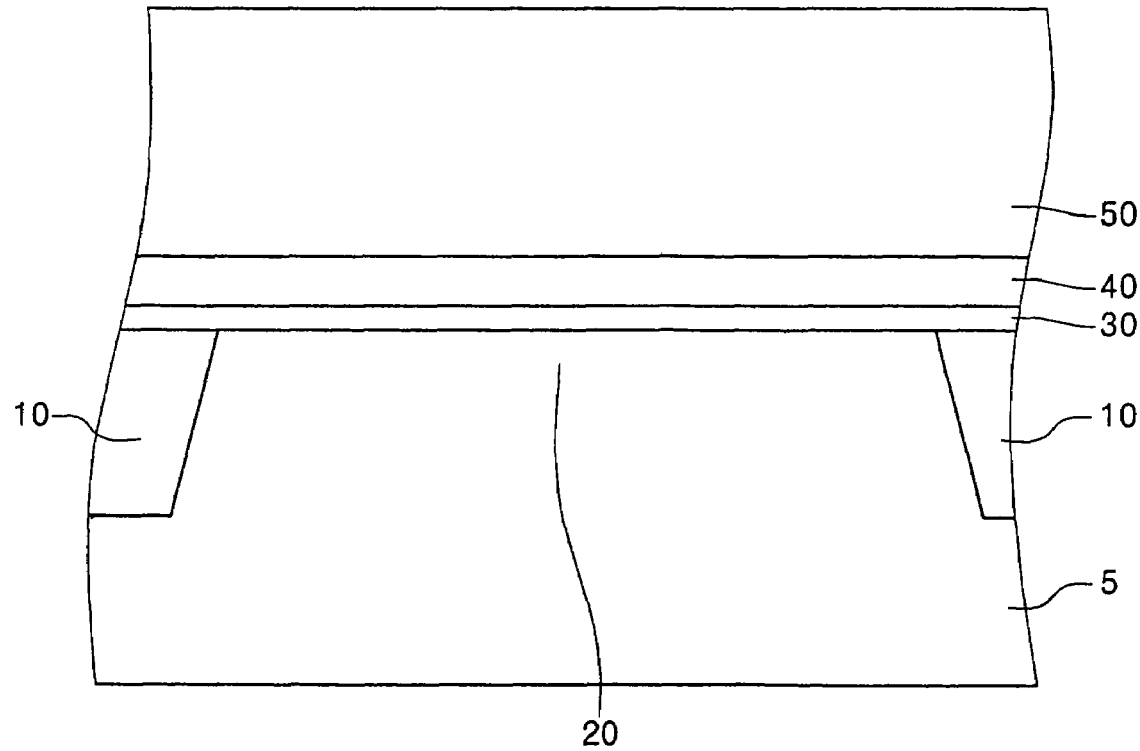

Referring to FIG. 4, an implantation masking layer 30, a BARC (buried anti-reflective coating) layer 40, and a photoresist layer 50 are sequentially deposited. The implantation masking layer 30 is comprised of an insulating material having an etch selectivity different from the STI structure 10. The BARC layer 40 enhances pattern transfer to the photoresist layer 50, and the present invention may be practiced with or without the BARC layer 40.

Figure 5:
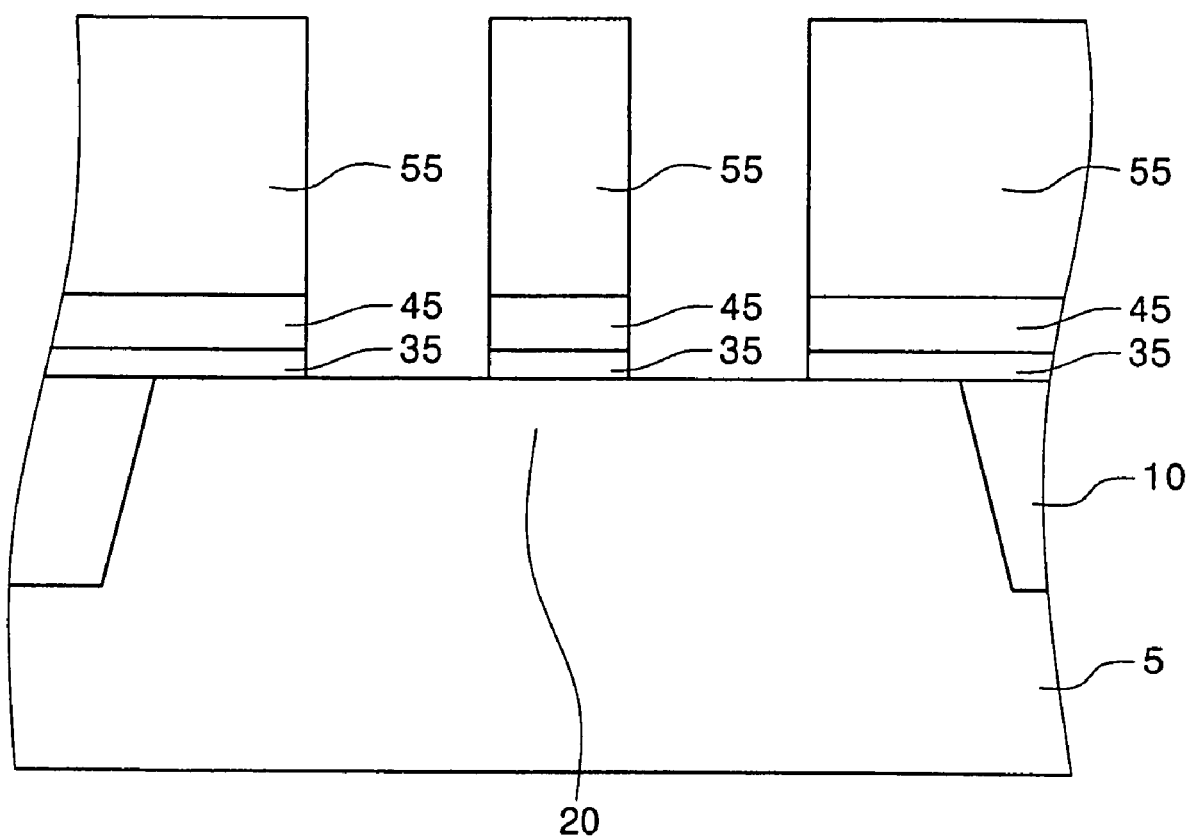

Referring to FIG. 5, the photoresist layer 50, the BARC layer 40, and the implantation masking layer 30 are patterned to form openings there-through. For example, the photoresist layer 50 is first patterned in a photolithography process. And the exposed portions of the BARC layer 40 and the implantation masking layer 30 are subsequently etched using the patterned photoresist layer 50 as an etch mask.

Further referring to FIG. 5, portions of the semiconductor substrate 5 are exposed through the openings formed in the photoresist layer 50, the BARC layer 40, and the implantation masking layer 30. In addition, the remaining portions of the photoresist layer 50, the BARC layer 40, and the implantation masking layer 30 form a photoresist pattern 55, a BARC pattern 45, and an implantation masking pattern 35, respectively.

Figure 6:
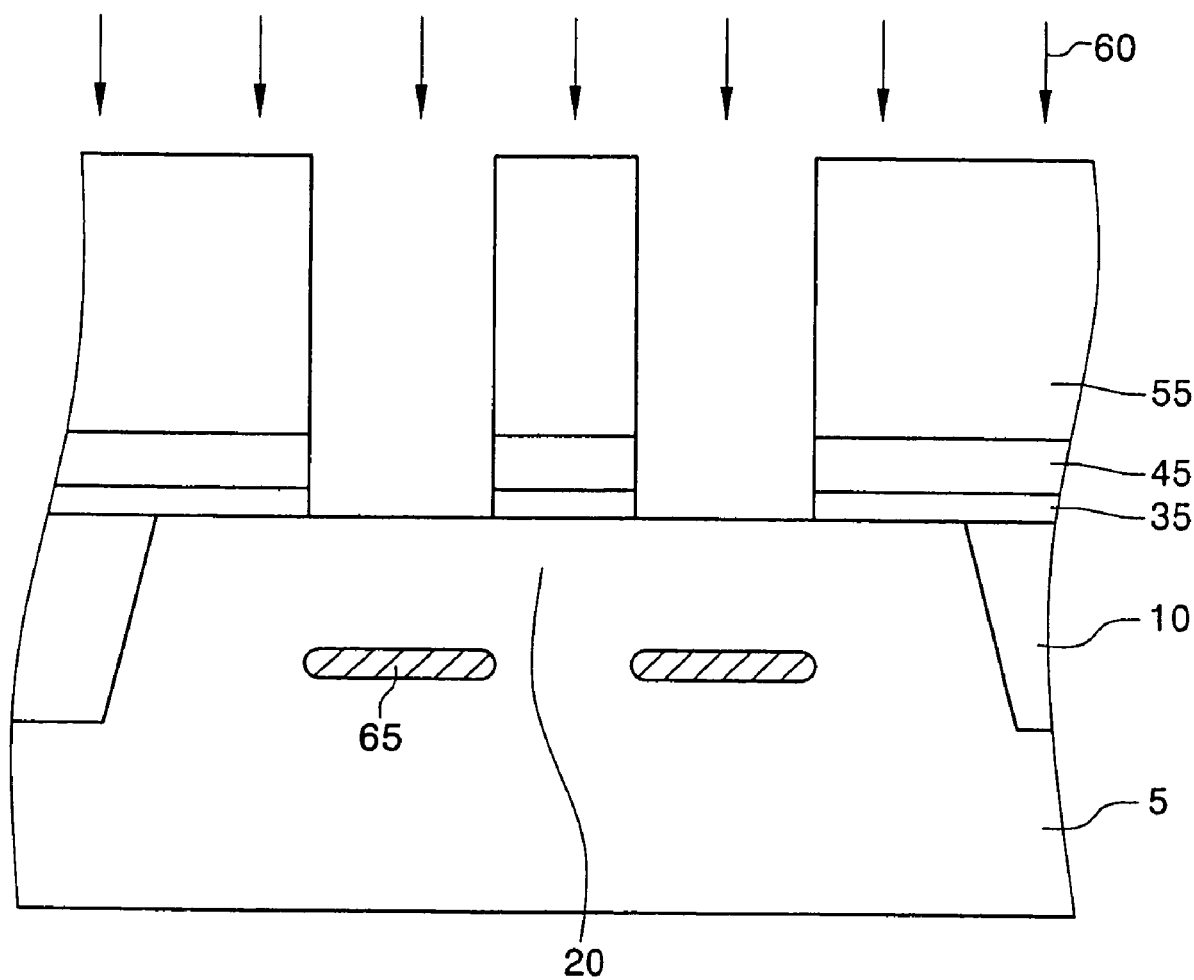

Thereafter referring to FIG. 6, ion implantation 60 is performed with the photoresist pattern 55, the BARC pattern 45, and the implantation masking pattern 35 acting as an implantation mask to form extra-doped channel regions 65. The extra-doped channel regions 65 are formed at a predetermined depth from the top surface of the semiconductor substrate 5. The ion implantation 60 is for doping the extra-doped channel regions 65 with a dopant of a first conductivity type that is same or opposite of the conductivity type of the semiconductor substrate 5.

Figure 7:
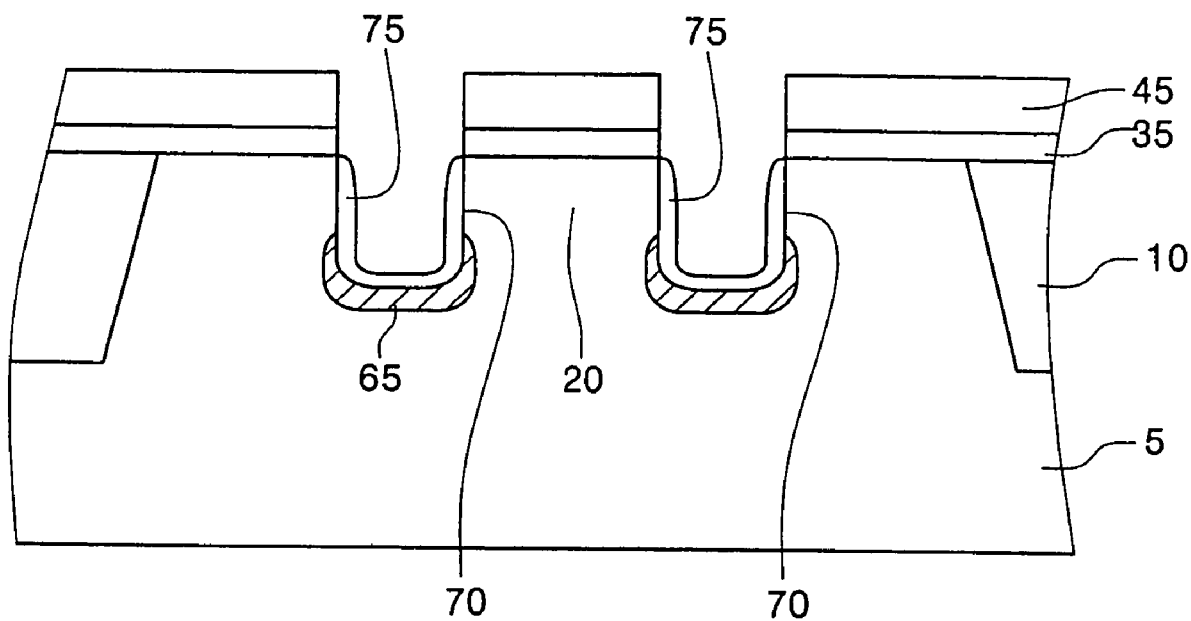

Referring to FIG. 7, the photoresist pattern 55 is removed, and subsequently, exposed portions of the semiconductor substrate 5 are etched using the BARC pattern 45 and the implantation masking pattern 35 as an etch mask. Thus, openings 70 are formed within the active region 20 of the semiconductor substrate 5. The openings 70 are each formed as a trench in an example embodiment of the present invention.

In addition, each opening 70 is etched into a respective extra-doped channel region 65 such that the extra-doped channel region 65 surrounds a lower portion of the opening 70. In an example embodiment of the present invention, the bottom wall of the opening 70 abuts the extra-doped channel region 65. In addition, a portion of the sidewalls of the opening 70 below half the height of the opening 70 abuts the extra-doped channel region 65, in an example embodiment of the present invention.

Further referring to FIG. 7, a first oxidation process is performed to form a sacrificial insulating layer 75 at exposed walls of the openings 70. In one embodiment of the present invention, the openings 70 further extend into the extra-doped channel regions 65 from the oxidation process. In that case, the openings 70 may be initially formed without extending into the extra-doped channel regions 65. Then, after the oxidation process for forming the sacrificial insulating layer 75, the openings 70 extend into the extra-doped channel regions 65.

The sacrificial insulating layer 75 is comprised of silicon dioxide ($SiO_2$) in one embodiment of the present invention. The sacrificial insulating layer 75 stabilizes the interface state of the semiconductor material at the walls of the openings 70.

Figure 8:
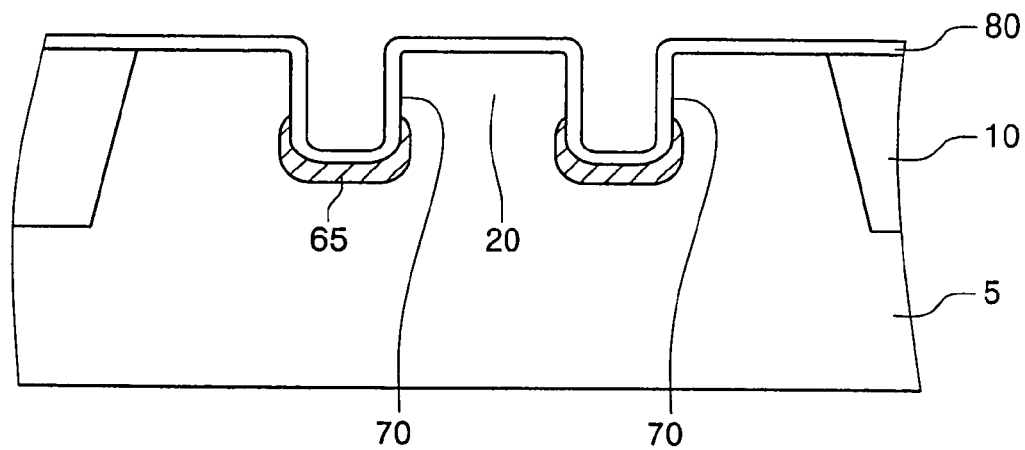

Thereafter referring to FIG. 8, the BARC pattern 45, the implantation masking pattern 35, and the sacrificial insulating layer 75 are removed. In addition, a second oxidation process is performed to form a gate insulator material 80 on exposed surfaces of the semiconductor substrate 5 including on the walls of the openings 70. The gate insulator material 80 is comprised of a silicon oxide ($Si_xO_y$) or a silicon oxynitride ($Si_xO_yN_z$), in one embodiment of the present invention.

Figure 9:
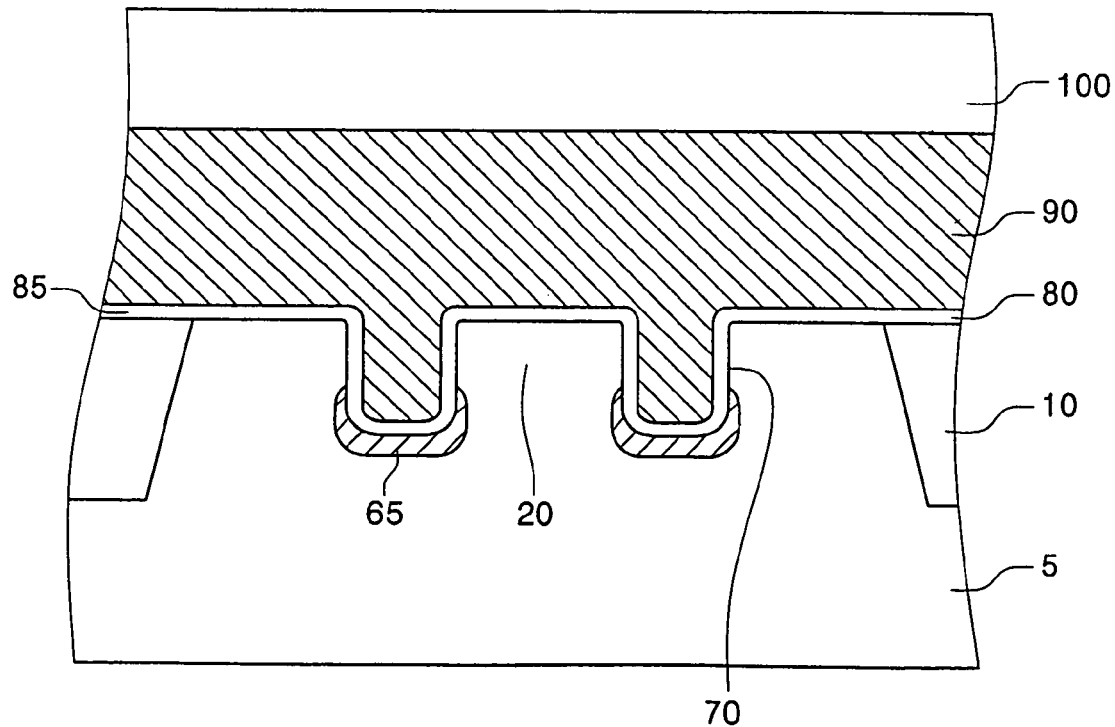
Figure 10:
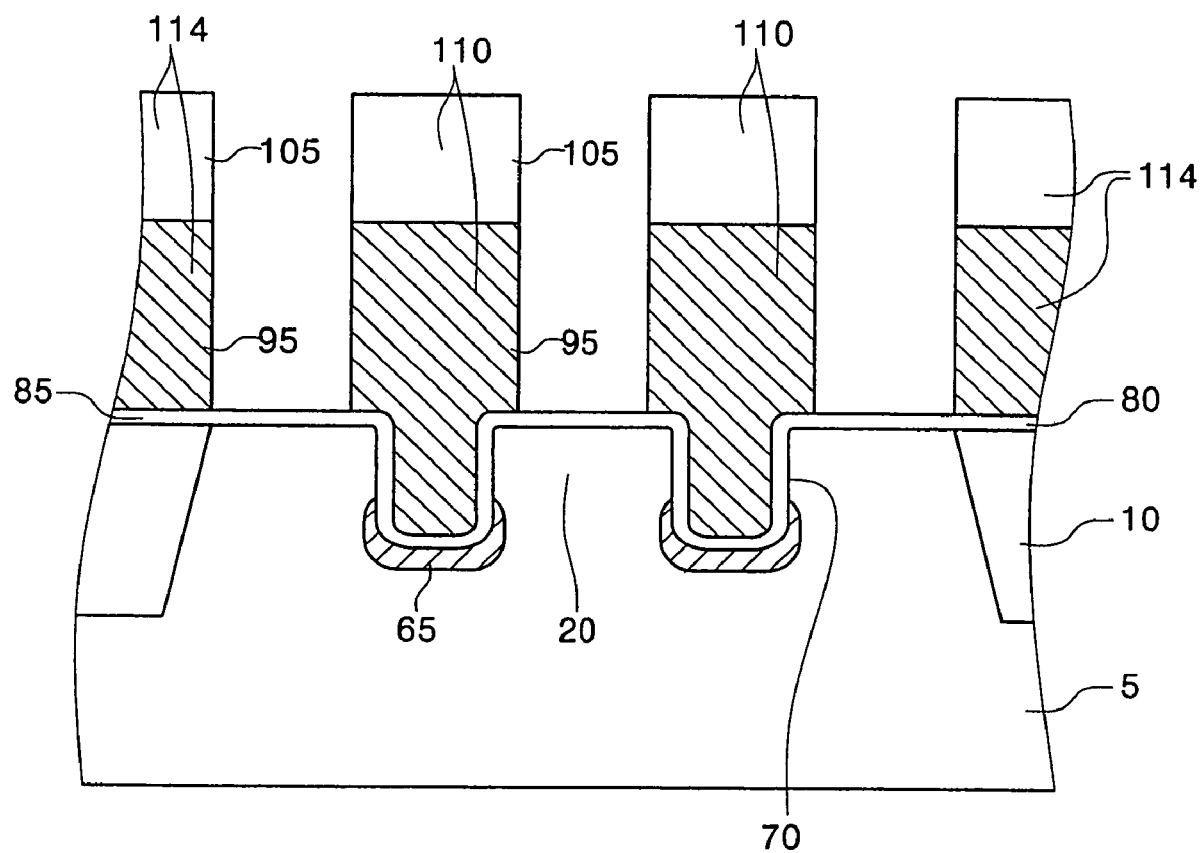

Subsequently, referring to FIG. 9, a gate electrode material 90 and a gate capping material 100 are deposited sequentially. The gate electrode material 90 fills the openings 70, and the gate capping material 100 is formed to cover the gate electrode material 90.

The gate electrode material 90 is comprised of polysilicon with N or P type conductivity with a metal silicide stacked thereon. In addition, the conductivity type of the polysilicon forming the gate electrode material 90 is opposite to the conductivity type of the extra-doped channel region 65, in one embodiment of the present invention. The gate capping material 100 is comprised of an insulating material, such as silicon nitride ($Si_3N_4$) for example, having an etch selectivity different from the gate insulator material 80.

The gate electrode material 90 and the gate capping material 100 are patterned to form gate electrodes 95 and gate capping layers 105. Each gate electrode 95 formed within the active region 20 fills one of the openings 70. The gate insulator material 80 acts as an etch stop during such patterning for the gate electrodes 95 and the gate capping layers 105. Each gate electrode 95 and gate capping layer 105 formed within the active region 20 forms a line pattern 110 for the field effect transistor, and each gate electrode 95 and gate capping layer 105 formed on the STI structure 10 forms an inactive line pattern 114.

Figure 11:
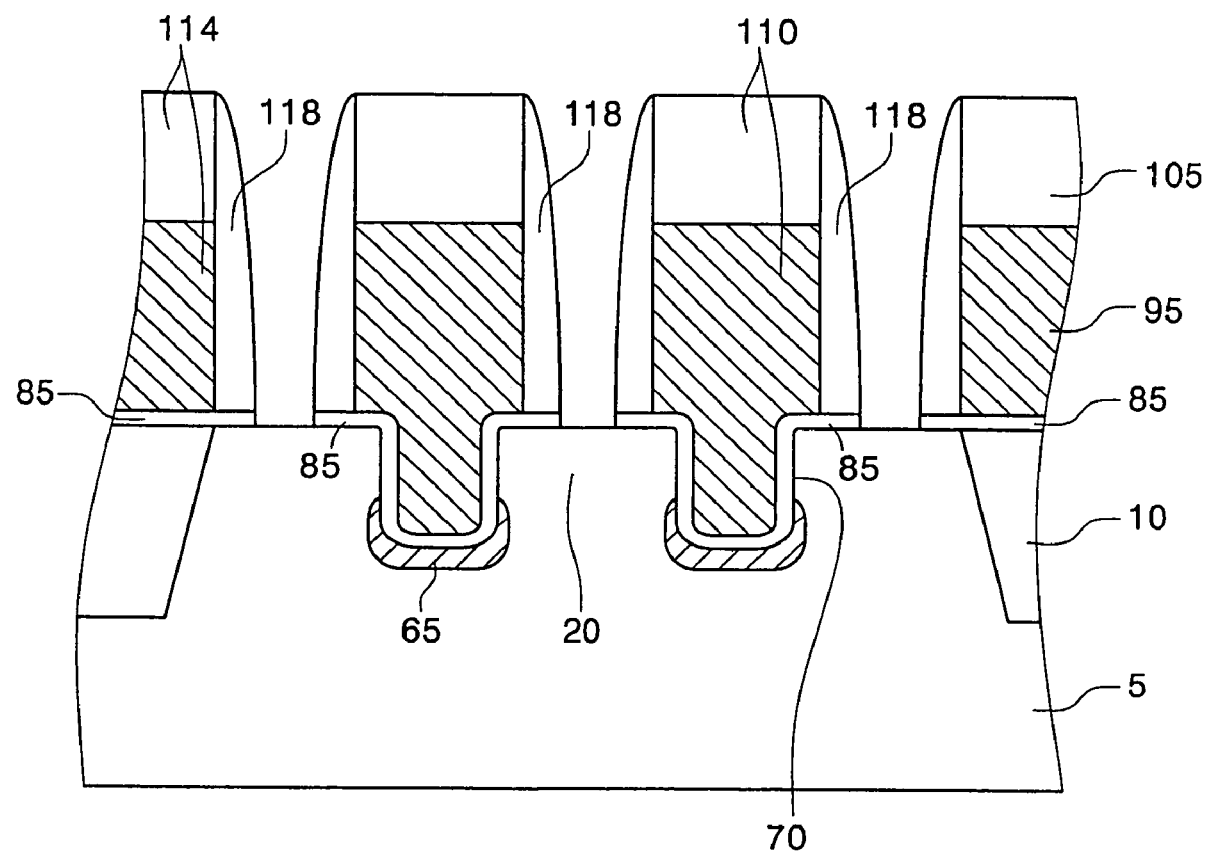

Referring to FIG. 11, the spacers 118 are formed on sidewalls of the gate electrodes 95 and the gate capping layers 105. Thereafter, exposed portions of the gate insulator material 80 are etched away to expose the portions of the semiconductor substrate 5 between the spacers 118. In this manner, remaining portions of the gate insulator material 80 forms a gate insulator 85 disposed at walls of the openings 70 and under the spacers 118. The spacers 118 are comprised of an insulating material having the same etch selectivity as the gate capping layer 105.

Figure 12:
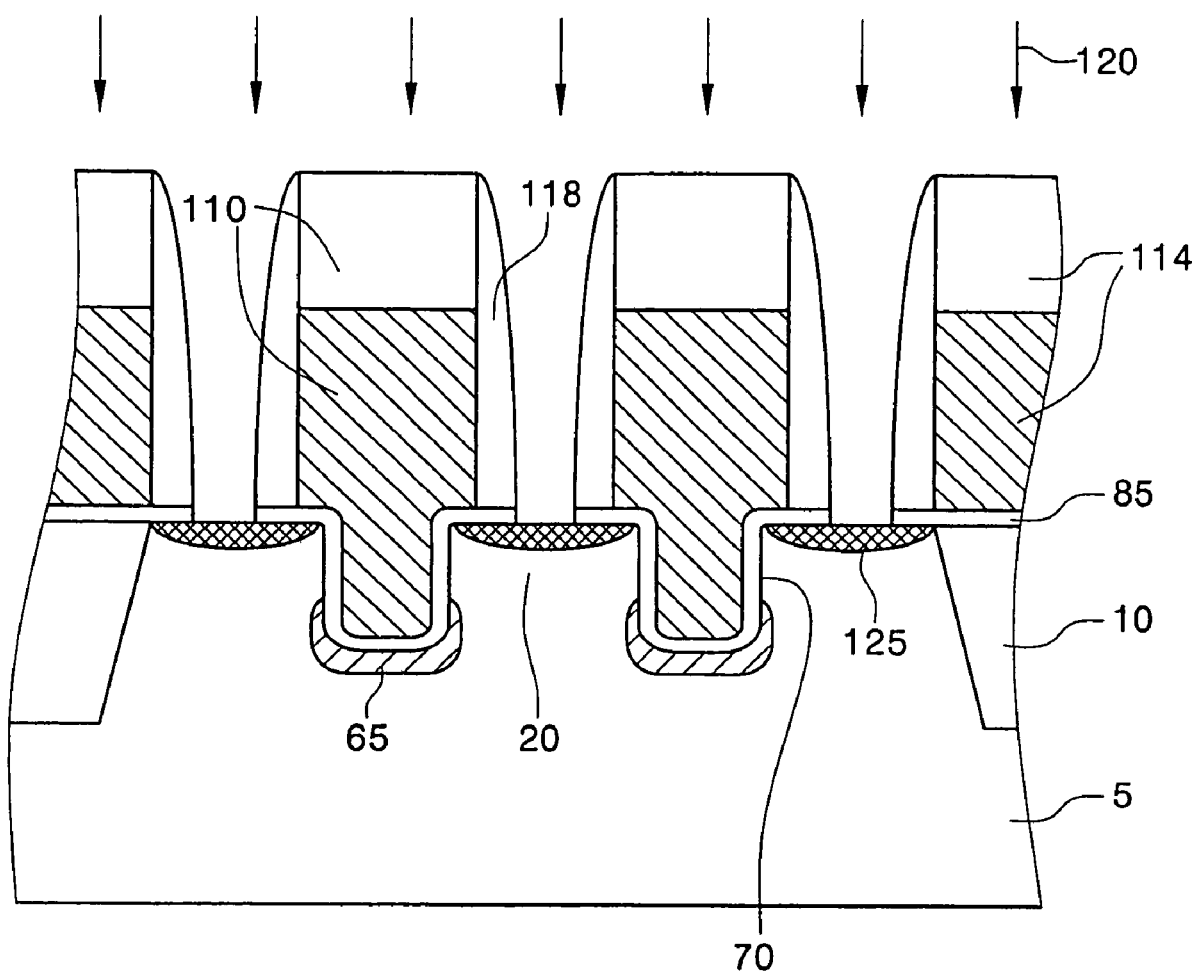

Referring to FIG. 12, an ion implantation process 120 is performed with the gate capping layers 105, the gate electrodes 95, and the spacers 118 acting as implantation masks. A dopant is implanted into exposed portions of the semiconductor substrate 5 to form source/drain regions 125. After thermal diffusion, the source/drain regions 125 spread out to be disposed under portions of the gate insulator 85 and the gate electrode 95.

In addition, the dopant within the source/drain regions 125 have a second conductivity type that is opposite to the first conductivity type of the dopant within the extra-doped channel region 65. In addition, the dose of the dopant within the source/drain regions 125 is higher than that of the dopant within the extra-doped channel region 65.

A pair of the source/drain regions 125 disposed to the two sides of the opening 70 within the active region 20 form a source and a drain for a field effect transistor of the present invention. In addition, such a source and drain pair 125 and the gate electrode 95 and the gate insulator 85 filling such an opening 70 define a field effect transistor of the present invention.

Figure 13:
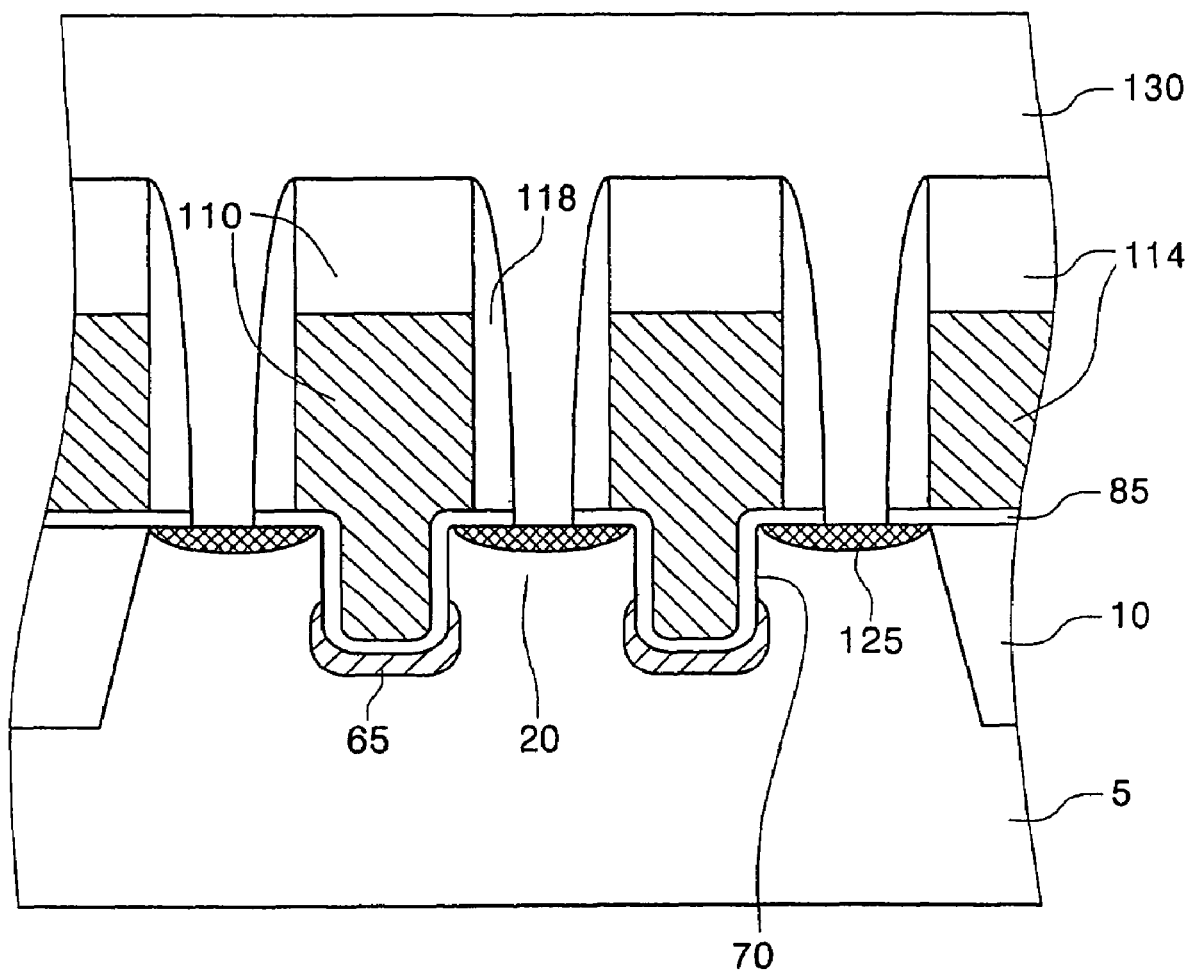
Figure 14:
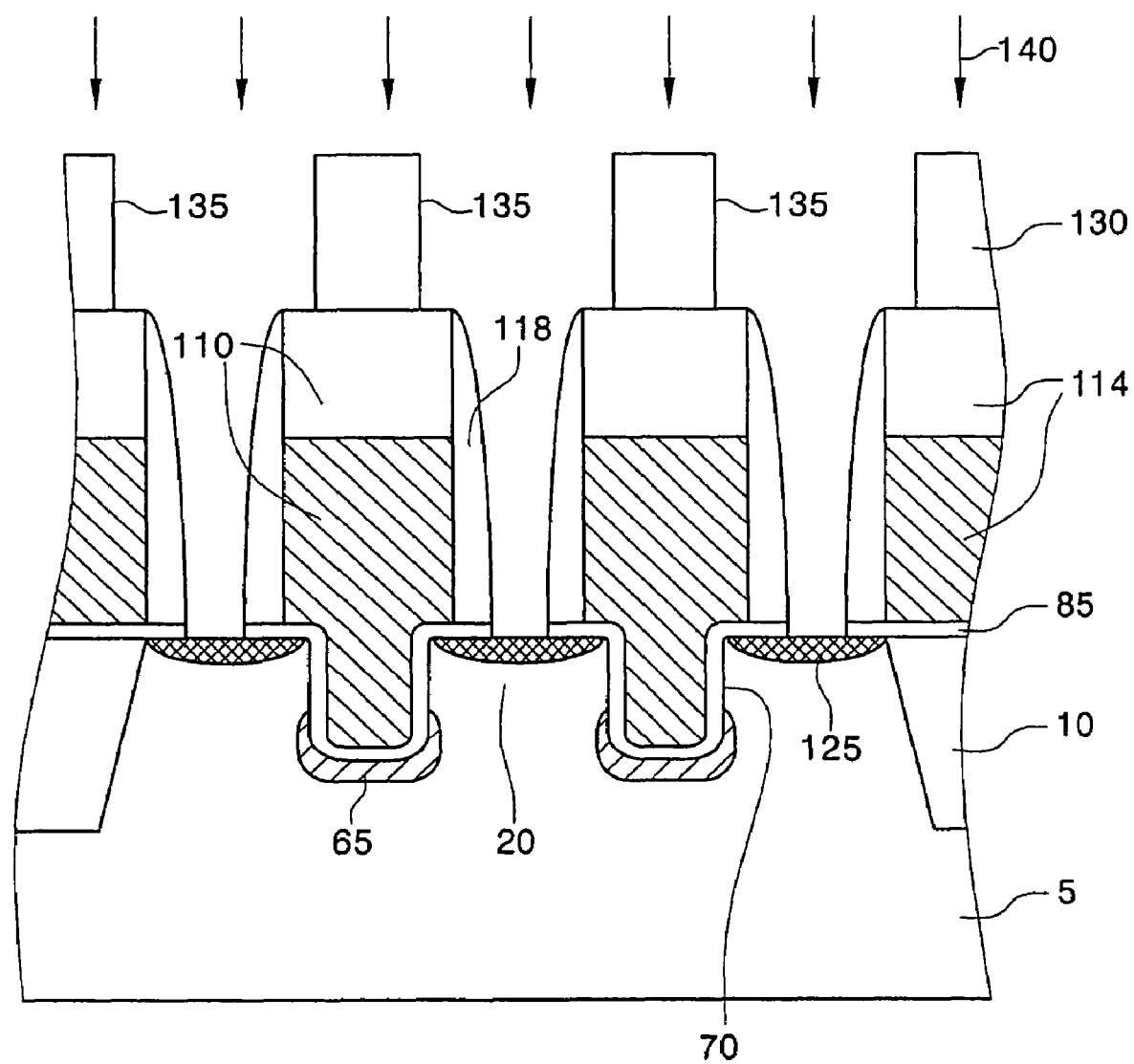

Thereafter referring to FIG. 13, an interlayer insulating material 130 is blanket-deposited to cover the structures on the semiconductor substrate 5. Referring to FIG. 14, the interlayer insulating material 130 is patterned to form landing pad openings 135 over the source/drain regions 125. In one embodiment of the present invention, the upper portions of the landing pad openings 135 have a larger diameter than that of the lower portions. The upper portions of the landing pad openings 135 are surrounded by the remaining interlayer insulating material 130, and the lower portions of the landing pad openings 135 are surrounded by the spacers 118.

Figure 15:
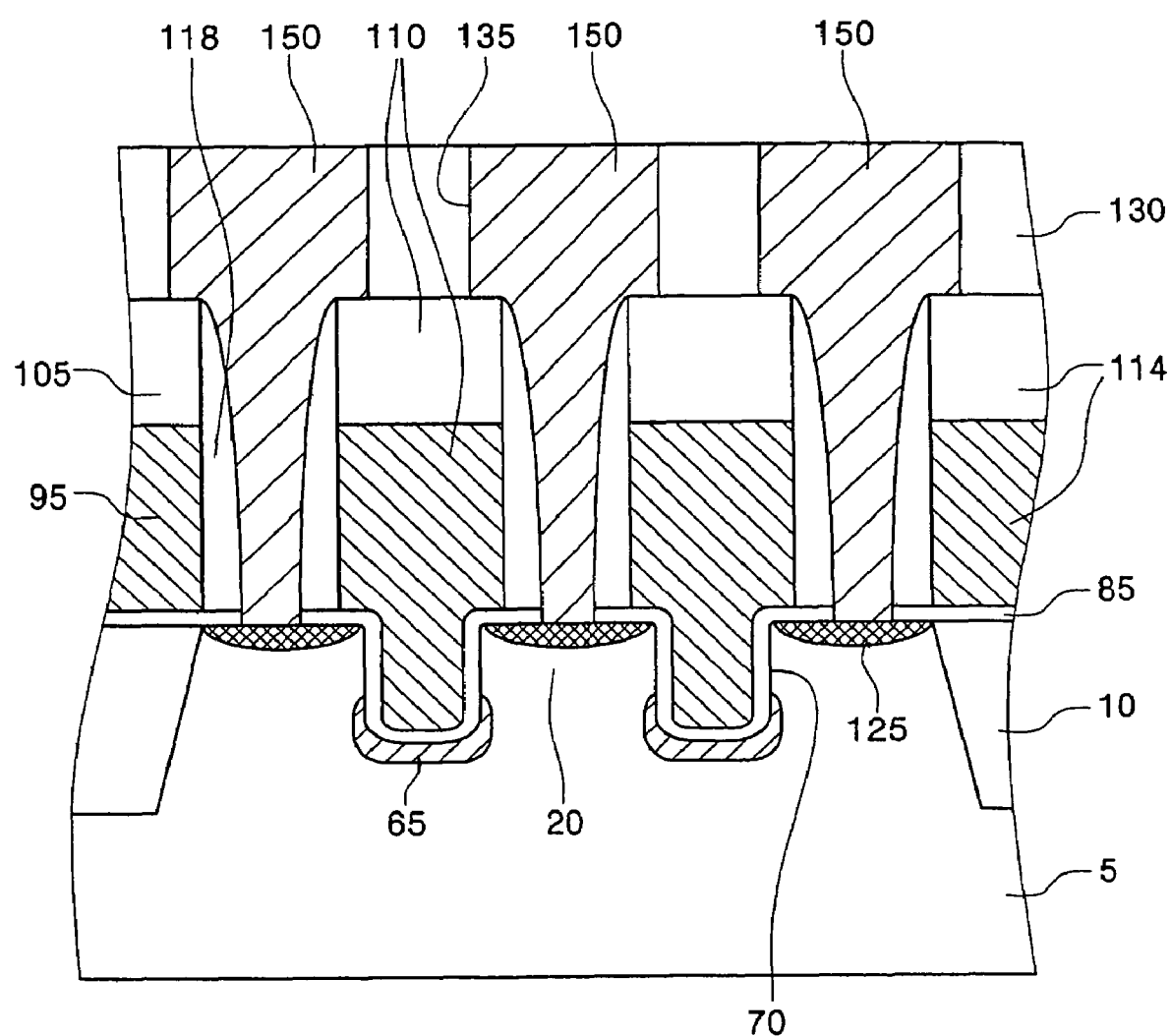

Referring to FIG. 15, landing pads 150 are formed to fill the landing pad openings 135. Each landing pad 150 contacts a respective source/drain 125. In addition referring to FIG. 14, an additional ion implantation process 140 may be performed prior to the formation of the landing pads 150 in FIG. 15 for reducing contact resistance of the landing pads 150. The landing pads 150 are comprised of polysilicon having the same conductivity type as the source/drain regions 125, in one embodiment of the present invention.

In this manner, the extra-doped channel region 65 abuts the gate insulator 85 at the bottom portion of the opening 70 containing the gate electrode 95. Thus, the field effect transistor formed with such structures has reduced body effect for more stable operation.

Figure 16:
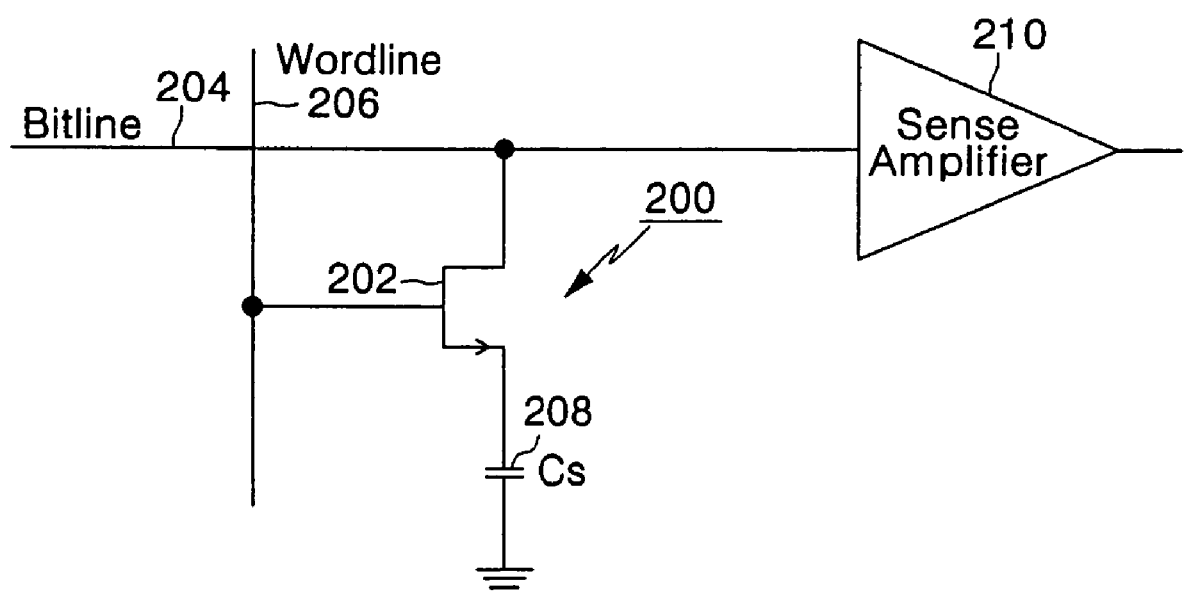
FIG. 16 shows a circuit diagram of a DRAM (dynamic random access memory) cell having a field effect transistor formed according to the present invention.

Referring to FIG. 16, such a field effect transistor 202 is advantageously formed as part of a DRAM (dynamic random access memory) cell 200. The field effect transistor 202 is fabricated according to the process as illustrated in FIGS. 3-15 within the active region 20 of the semiconductor substrate 5. In that case, the drain 125 of the field effect transistor 202 forms a bit line 204 of the DRAM cell 200 with such a bit line 204 being coupled to a sense amplifier 210. In addition, the gate electrode 95 forms a word line 206 of the DRAM cell 200. Furthermore, the source 125 is coupled to a charge storage node of a capacitor 208. For example, the charge storage node of the capacitor 208 is formed onto the landing pad 150 for the source 125.

While the present invention has been particularly shown and described with reference to exemplary embodiments thereof, it will be understood by those of ordinary skill in the art that various changes in form and details may be made therein without departing from the spirit and scope of the present invention as defined by the following claims.

Thus, the foregoing is by way of example only and is not intended to be limiting. For example, although a field effect transistor formed according to the present invention is described for application within a DRAM cell, the field effect transistor formed according to the present invention may also be used in other integrated circuits. In addition, any materials or numbers of elements illustrated and described herein are by way of example only.

The present invention is limited only as defined in the following claims and equivalents thereof.

What is claimed is:

1. A method for fabricating a field effect transistor, comprising:

forming an extra-doped channel region below a surface of a semiconductor substrate;

forming an opening in the semiconductor substrate into the extra-doped channel region to face the extra-doped channel region at a bottom portion of the opening;

forming a gate insulator at walls of the opening such that the extra-doped channel region abuts the gate insulator at the bottom portion of the opening; and filling the opening with a gate electrode;

wherein the extra-doped channel region abuts the gate insulator at a bottom wall and sidewalls of the opening below a half-height of the opening, and wherein the semiconductor substrate instead of the extra-doped channel region abuts the gate insulator at sidewalls of the opening above the half-height of the opening.

2. The method of claim 1, further comprising:

forming a drain and a source in the semiconductor substrate to the sides of the opening with an overlap under the gate insulator and the gate electrode.

3. The method of claim 2, wherein a conductivity type of a dopant within the extra-doped channel region is opposite to a respective conductivity type of a respective dopant in each of the drain, the source, and the gate electrode.

4. The method of claim 2, further comprising:

forming a respective line pad on each of the drain and the source.

5. The method of claim 4, further comprising:

forming the field effect transistor as part of a DRAM (dynamic random access memory) cell.

6. The method of claim 5, wherein the respective line pad disposed on the source is coupled to a storage capacitor of the DRAM cell, and wherein the gate electrode forms a word line for the DRAM cell.

7. The method of claim 1, further comprising:

forming a STI (shallow trench isolation) structure for defining an active region having the opening formed therein.

8. A method for fabricating a field effect transistor, comprising:

forming an extra-doped channel region below a surface of a semiconductor substrate;

forming an opening in the semiconductor substrate into the extra-doped channel region to face the extra-doped channel region at a bottom portion of the opening;

forming a gate insulator at walls of the opening such that the extra-doped channel region abuts the gate insulator at the bottom portion of the opening, and wherein the semiconductor substrate instead of the extra-doped channel region abuts the gate insulator at a top portion of sidewalls of the opening; and filling the opening with a gate electrode;

wherein the opening is formed after the extra-doped channel region is formed.

9. The method of claim 8, wherein the extra-doped channel region abuts the gate insulator at a bottom wall and sidewalls of the opening below a half-height of the opening.

10. The method of claim 8, further comprising:

forming a drain and a source in the semiconductor substrate to the sides of the opening with an overlap under the gate insulator and the gate electrode.

11. The method of claim 10, wherein a conductivity type of a dopant within the extra-doped channel region is opposite to a respective conductivity type of a respective dopant in each of the drain, the source, and the gate electrode.

12. The method of claim 10, further comprising:

forming a respective line pad on each of the drain and the source.

13. The method of claim 12, further comprising:

forming the field effect transistor as part of a DRAM (dynamic random access memory) cell, wherein the respective line pad disposed on the source is coupled to a storage capacitor of the DRAM cell, and wherein the gate electrode forms a word line for the DRAM cell.

14. The method of claim 8, further comprising:

forming a gate capping layer on the gate electrode; and forming spacers on sidewalls of the gate electrode and the gate capping layer.

15. The method of claim 8, further comprising:

forming a STI (shallow trench isolation) structure for defining an active region having the opening formed therein.

16. A method for fabricating a field effect transistor, comprising:

forming an extra-doped channel region below a surface of a semiconductor substrate;

forming an opening in the semiconductor substrate into the extra-doped channel region to face the extra-doped channel region at a bottom portion of the opening;

forming a gate insulator at walls of the opening such that the extra-doped channel region abuts the gate insulator at the bottom portion of the opening, and wherein the semiconductor substrate instead of the extra-doped channel region abuts the gate insulator at a top portion of sidewalls of the opening;

filling the opening with a gate electrode;

forming a gate capping layer on the gate electrode; and forming spacers on sidewalls of the gate electrode and the gate capping layer.

17. The method of claim 16, wherein the extra-doped channel region abuts the gate insulator at a bottom wall and sidewalls of the opening below a half-height of the opening.

18. The method of claim 16, further comprising:

forming a drain and a source in the semiconductor substrate to the sides of the opening with an overlap under the gate insulator and the gate electrode.

19. The method of claim 18, wherein a conductivity type of a dopant within the extra-doped channel region is opposite to a respective conductivity type of a respective dopant in each of the drain, the source, and the gate electrode.

20. The method of claim 18, further comprising:

forming a respective line pad on each of the drain and the source;

forming the field effect transistor as part of a DRAM (dynamic random access memory) cell, wherein the respective line pad disposed on the source is coupled to a storage capacitor of the DRAM cell, and wherein the gate electrode forms a word line for the DRAM cell.

* * * * *